(12) United States Patent
Sinsheimer

(10) Patent No.: US 7,295,024 B2
(45) Date of Patent: Nov. 13, 2007

(54) CONTACT SIGNAL BLOCKS FOR TRANSMISSION OF HIGH-SPEED SIGNALS

(75) Inventor: Roger Sinsheimer, Petaluma, CA (US)

(73) Assignee: Xandex, Inc., Petaluma, CA (US)

( * ) Notice: Subject to any disclaimer, the term of this patent is extended or adjusted under 35 U.S.C. 154(b) by 95 days.

(21) Appl. No.: 11/341,165

(22) Filed: Jan. 25, 2006

(65) Prior Publication Data

US 2006/0183377 A1  Aug. 17, 2006

Related U.S. Application Data

(60) Provisional application No. 60/658,562, filed on Mar. 3, 2005, provisional application No. 60/654,543, filed on Feb. 17, 2005.

(51) Int. Cl.
*G01R 31/02* (2006.01)

(52) U.S. Cl. .................................... 324/754

(58) Field of Classification Search ............. 324/754, 324/761, 762, 760, 765, 158.1; 439/608; 174/113 R
See application file for complete search history.

(56) References Cited

U.S. PATENT DOCUMENTS

| | | |
|---|---|---|
| 3,518,688 A | 6/1970 | Stayboldt et al. |
| 3,638,148 A | 1/1972 | Hallford et al. |
| 3,740,678 A | 6/1973 | Hill |
| 4,400,578 A | 8/1983 | Cookson et al. |
| 4,642,417 A * | 2/1987 | Ruthrof et al. ............ 174/36 |
| 4,680,423 A | 7/1987 | Bennett et al. |
| 5,724,012 A | 3/1998 | Teunisse |
| 6,420,889 B1 * | 7/2002 | Terada ...................... 324/755 |
| 6,590,161 B1 | 7/2003 | Bolouri-Saransar |
| 6,888,427 B2 | 5/2005 | Sinsheimer et al. |
| 2003/0001698 A1 | 1/2003 | Fjelstad |

FOREIGN PATENT DOCUMENTS

| | | |
|---|---|---|
| EP | 0343771 | 11/1989 |
| GB | 1275200 | 5/1972 |

OTHER PUBLICATIONS

Ivanov et al., "Two Stage Double Layer Microstrip Spatial Amplifiers", 1995, IEEE MTT-S Digest, pp. 589-592.
Farber, A.S., "Propagating Signals Across Semiconductor Wafers", IBM Technical Disclosure Bulletin, vol. 8, No. 6, Nov. 1965, pp. 924-925.

* cited by examiner

*Primary Examiner*—Minh N. Tang
*Assistant Examiner*—Tung X. Nguyen
(74) *Attorney, Agent, or Firm*—Beyer Weaver LLP

(57) ABSTRACT

A contact signal block for facilitating connections between test equipment and a device under test (DUT) is described. The contact signal block includes a plurality of ground layers and a plurality of signal transmission layers disposed between and alternating with the ground layers. Each signal transmission layer includes a plurality of signal conductors. Each signal conductor forms a controlled-impedance transmission line with adjacent ground layers and is terminated at a first end in a plurality of signal spring probes. A plurality of non-conductive spacer structures separates the ground layers and signal transmission layers and maintains a substantially constant separation between the ground layers and the signal conductors. The ground layers and the signal conductors are primarily separated by a medium having a loss tangent of approximately 0.002 and a dielectric constant of less than about 1.5.

11 Claims, 10 Drawing Sheets

CONTACT SIGNAL BLOCKS FOR TRANSMISSION OF HIGH-SPEED SIGNALS

RELATED APPLICATION DATA

The present application claims priority under 35 U.S.C. 119(e) to U.S. Provisional Patent Application No. 60/654,543, filed Feb. 17, 2005, and U.S. Provisional Patent Application No. 60/658,562, filed Mar. 3, 2005, the entire disclosures of both which are incorporated herein by reference for all purposes.

BACKGROUND OF THE INVENTION

The present invention relates to high-speed signal connections and, more specifically, to techniques for providing such connections between test equipment and devices under test (DUTs).

As test systems use an increasing number of signals to test electronic devices and chips, the reliability of the connections between the test systems and the devices under test (DUTs) becomes increasingly critical. Open or high impedance contacts can cause an otherwise good chip to appear to be bad, and are statistically more likely to occur as the number of signals increases. Much time and effort has been expended improving the reliability of the spring probes (also known as Pogo™ pins) used to make these contacts, but there appears, at least for now, to be a real-world limit of approximately 200 defects per million opportunities (DMPO), a rate described in statistical terms as a failure rate of $5\sigma$. It is a recognized standard in the industry that an acceptable quality product should meet or exceed a $6\sigma$ quality standard, or fewer than 3.4 DPMO.

Since it is not possible to meet this standard with conventional spring probe solutions, techniques for achieving this standard are needed.

SUMMARY OF THE INVENTION

According to the present invention, a variety of contact signal block architectures are provided which improve upon conventional connectivity solutions. According to a specific embodiment, a contact signal block for facilitating connections between test equipment and a device under test (DUT) is provided. The contact signal block includes a plurality of ground layers and a plurality of signal transmission layers disposed between and alternating with the ground layers. Each signal transmission layer includes a plurality of signal conductors. Each signal conductor forms a controlled-impedance transmission line with adjacent ground layers and is terminated at a first end in a plurality of signal spring probes. A plurality of non-conductive spacer structures separates the ground layers and signal transmission layers and maintains a substantially constant separation between the ground layers and the signal conductors. The ground layers and the signal conductors are primarily separated by a medium having a loss tangent of approximately 0.002 and a dielectric constant of less than about 1.5.

According to another specific embodiment, another contact signal block for facilitating connections between test equipment and a device under test (DUT) is provided. The contact signal block includes a plurality of layers, each of which includes two conductive planes bonded together with an intervening non-conductive material. A first one of the conductive planes is primarily for delivery of power to the DUT, and a second one of the conductive planes is primarily for return of power from the DUT. The contact signal block further includes a plurality of non-conductive spacer structures separating the layers and maintaining a substantially constant separation between the layers.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventor for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Figure 1:
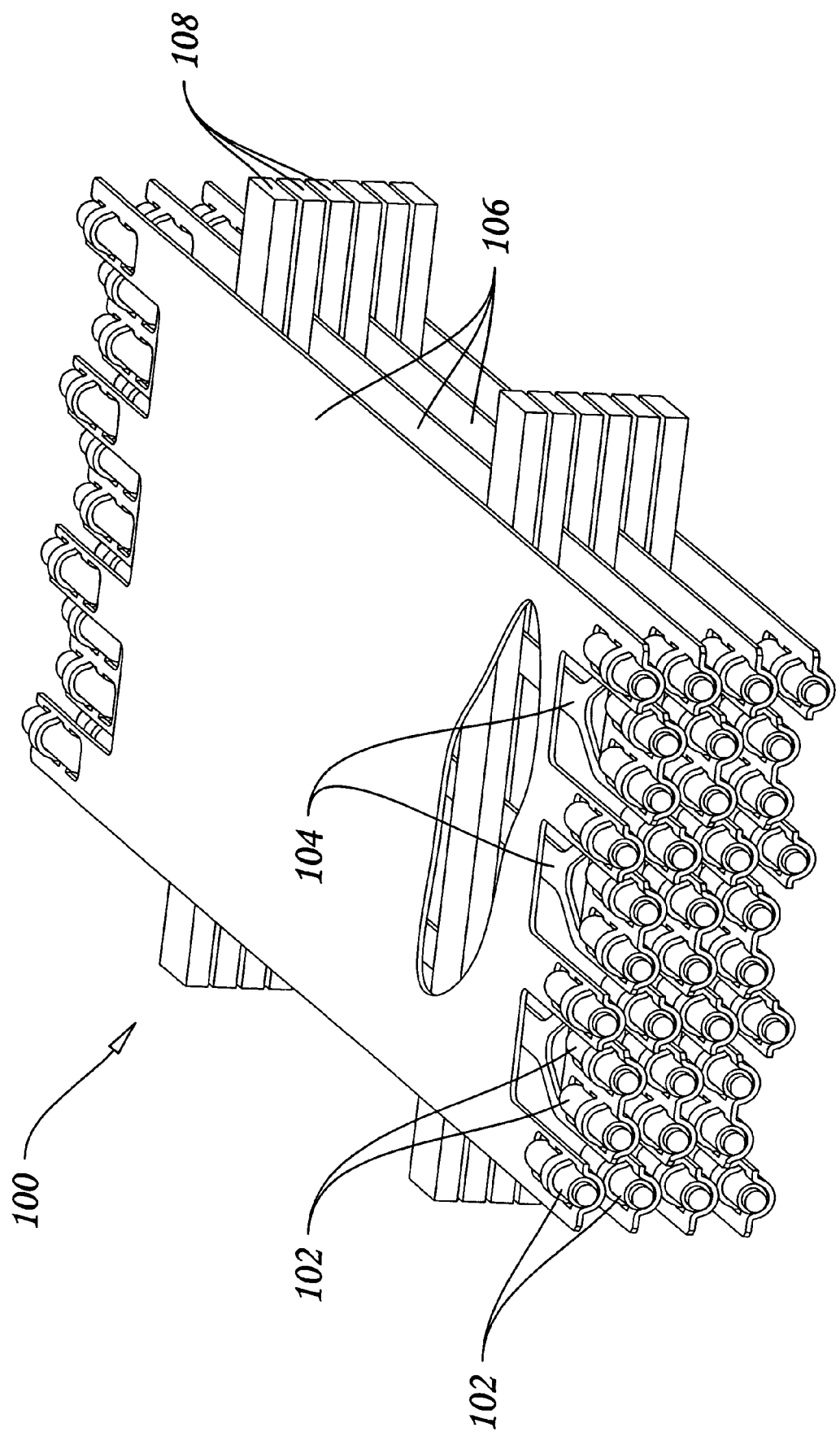
FIG. 1 shows a contact signal block implemented according to a specific embodiment of the present invention.
Figure 2:
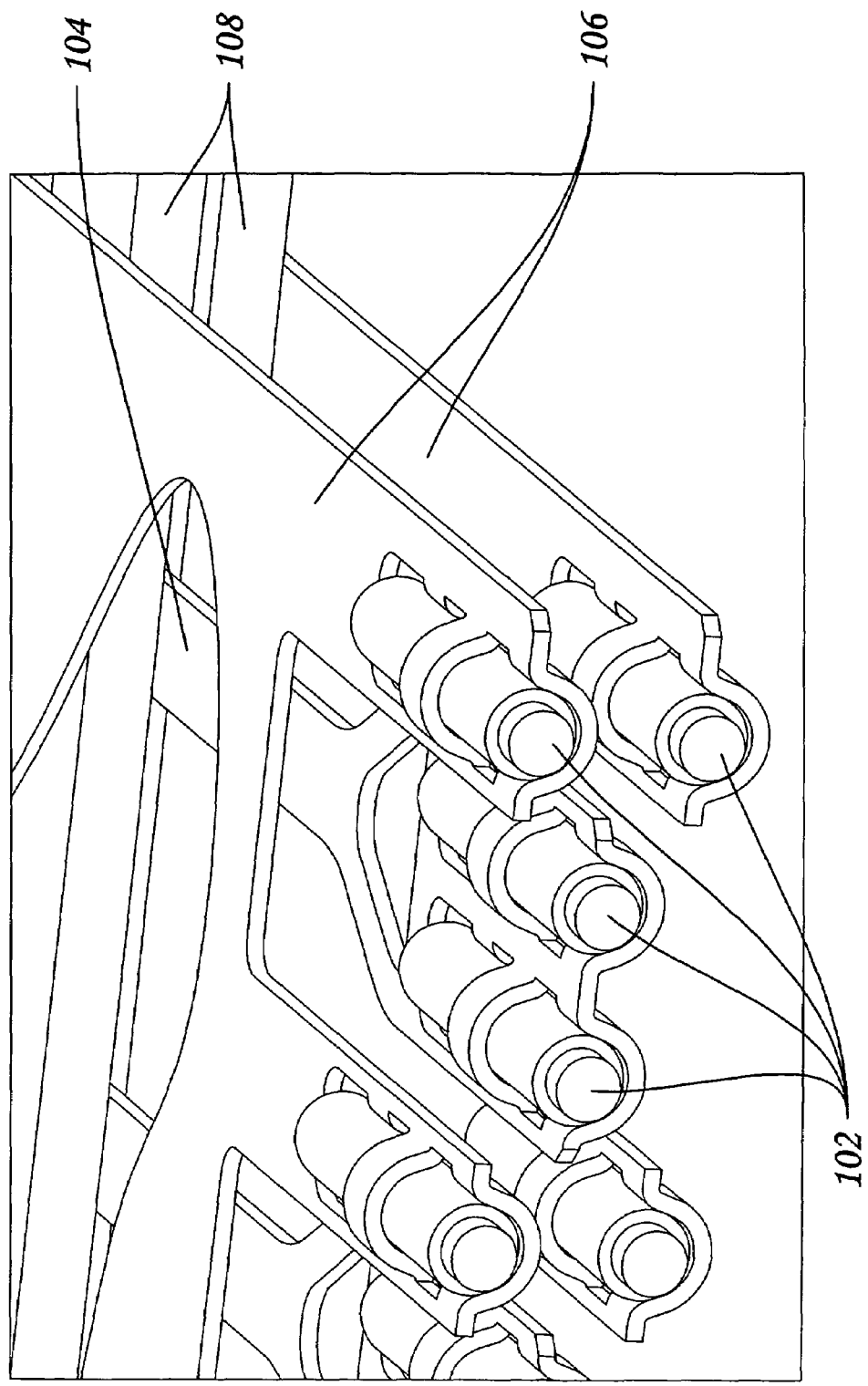
FIG. 2 shows a magnified view of a portion of the contact signal block of FIG. 1.

Embodiments of the present invention address the limitations of conventional approaches to establishing high-speed connections in test systems in a variety of ways. According to a specific embodiment of the invention shown in FIGS. 1 and 2, inadequate spring probe reliability is addressed through the use of redundant spring probes. In the specific embodiment shown, two $5\sigma$ spring probes 102 are configured in parallel at each end of the signal path 104 thereby providing (theoretically) a quality level of 0.04 DPMO. Spring probes from Interconnect Device, Inc. (IDI), of Kansas City, Kans., or Everett Charles Technologies (ECT) of Pomona, Calif., or any other high quality spring probe manufacturer may be employed.

According to other embodiments, additional spring probes (e.g., 3 or more) may be employed at each signal path end to provide a greater level of redundancy (and therefore a higher statistical level of quality). Embodiments are also contemplated in which only one end of each signal path is terminated in multiple spring probes, i.e., the other end may be permanently secured or have some other form of termination.

In high speed test systems, signals must be passed from board to board over interconnects, often over a distance of several inches, with a high level of fidelity and signal integrity. In conventional test systems, this is typically accomplished by creating a carefully spaced array of long double-ended spring probes. Unfortunately, spring probes are round structures that radiate electrically in all directions and generally provide a poor level of impedance control due to their less-than optimal shape.

Therefore, specific embodiments of the invention include a contact signal block in which a controlled impedance environment is provided for the signal paths. According to a specific embodiment (shown in FIGS. 1 and 2), the signal paths 104 are implemented in a "stripline" environment, i.e., an environment in which a signal is carried on a conductive path between two ground conductors. Such an approach is employed in printed circuit boards using, for example, a rigid dielectric glass/resin phenolic material (e.g., FR-4 or G-10) to separate the transmission lines from the ground planes.

By contrast, according to specific embodiments of the present invention, except for an occasional non-conductive spacer bar 108, the medium between signal conductors 104 and ground planes 106 is air or vacuum. This enables a very dense packing of the layers of contact signal block 100 due to the very low dielectric constant of air or vacuum. That is, the lower the dielectric constant of the medium between the signals and the grounds, the closer they can be to each other while maintaining a particular impedance with a given trace width. One advantage of this approach is that relatively wide conductors may be used to make the connection between the two sets of spring probes, thereby reducing the conductive losses normally seen in planar electrical structures due to skin effect.

Another common source of loss in impedance controlled structures is dielectric loss, usually measured as a "loss tangent." The loss tangent of air or vacuum is extremely low, reducing the signal loss per unit length in the structure by approximately 50-90% relative to conventional solutions. Other materials which have suitably low loss tangents for use with various embodiments of the invention include foamed materials such as, for example, polyimide, silicone, or Teflon®.

Conventional solutions employing Pogo pins use air for the medium between conductors but, because of conductor geometry, i.e., circular cross sections which radiate electrically in all directions, generally provide a poor level of impedance control. Other conventional solutions having more suitable geometries employ dielectrics which typically have a loss tangent on the order of 0.02 (for low quality materials) to, at best, 0.0003 (for very expensive materials, e.g., Teflon®).

By contrast, and according to specific embodiments of the invention, a controlled impedance environment is provided which has both a desirable geometry and a dielectric medium having a suitably low loss tangent. According to some embodiments, the loss tangent is approximately 0.002.

According to some embodiments, the dielectric medium has a dielectric constant under about 1.5 (and preferably under 1.2) as compared to conventional approaches in which the lowest value is typically 2.1 or above. According to some embodiments, dielectrics having a loss tangent of about 0.002 and a dielectric constant less than about 1.5 are employed.

Specific implementations may employ a variety of dielectrics including, for example, air (dielectric loss tangent of 0.002 and dielectric constant (Er) of 1.0006), foamed materials (e.g., Teflon, silicone, and polyimide having dielectric loss tangents of 0.002-0.004 and Er of 1.15-1.5), conventional low loss materials (e.g., Teflon having a dielectric loss tangent of 0.0003 and an Er of 2.1), and other conventional materials (e.g., FR-4 having a dielectric loss tangent of 0.02 and an Er of 4.5).

Additional approaches to constructing impedance-controlled environments for transmission lines having low loss tangents and which may be employed with various embodiments of the invention are described in U.S. Pat. No. 6,888,427 the entire disclosure of which is incorporated herein by reference for all purposes.

As will be understood, the most suitable materials for transmission lines 104, ground planes 106, and spacer bars 108 may vary in accordance with the requirements of a particular application. According to some embodiments, the ground planes and transmission lines are made from copper with an appropriate plating (e.g., gold, silver, palladium-nickel, tin, etc.) to inhibit oxidation. Other conductive materials (e.g., silver and bucky-paper) may also be used. Spacer bars or equivalent structures may comprise a wide variety of non-conductive materials such as, for example, Rexolite® or polyphenylene sulfide (PPS), depending upon the desired specific form, manufacturing techniques employed, and/or mechanical properties needed for the specific application.

Figure 3:
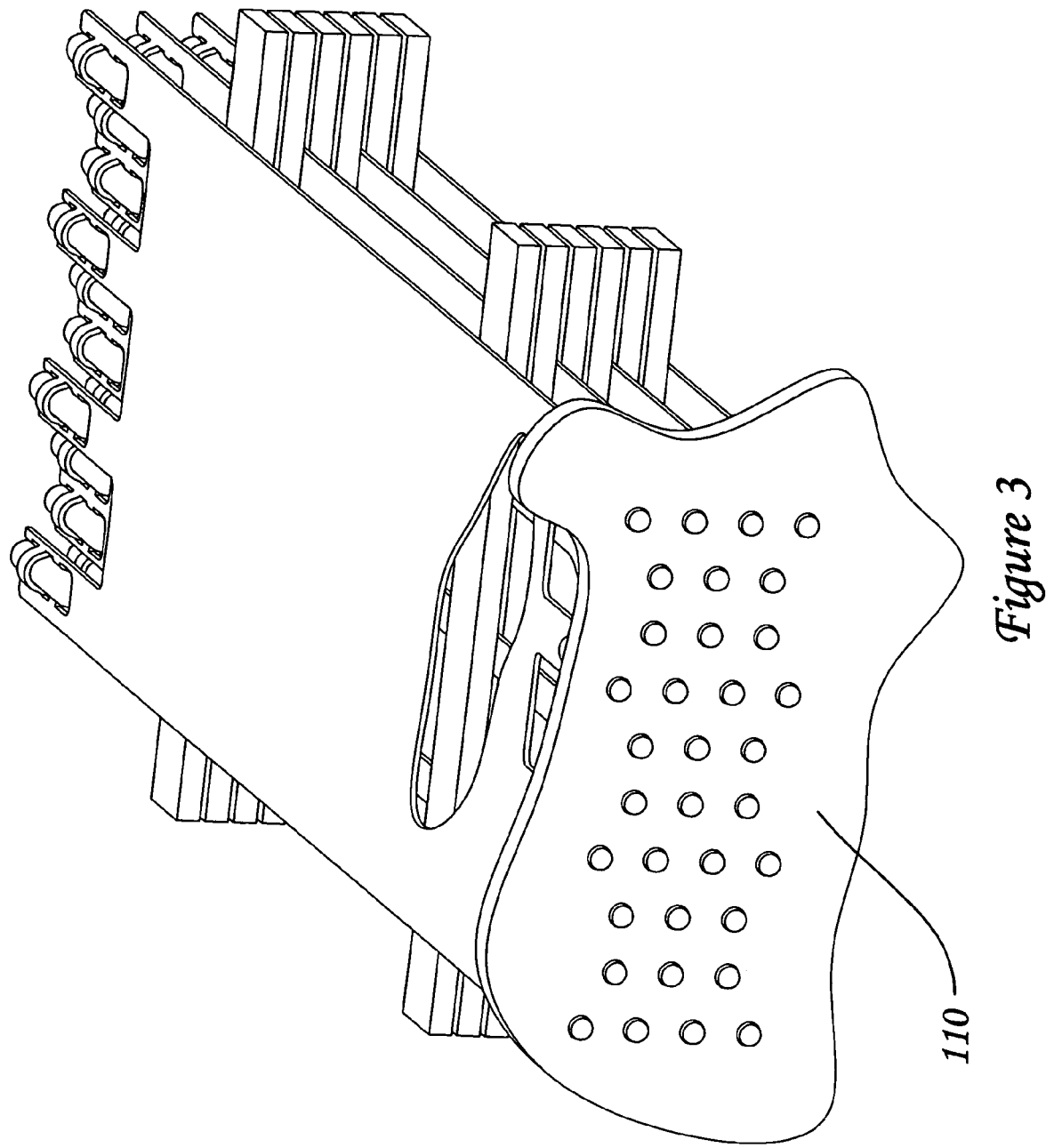
FIG. 3 illustrates a contact alignment mechanism which may be employed with various embodiments of the invention.

The alternating layers of signal conductors and ground planes provided by specific embodiments of the invention result in a highly dense and very high performance set of transmission lines. According to some embodiments, the contact signal block may be encased in a non-conductive (e.g., plastic or other non-conductive material) housing which insulates the block from, for example, any surface or structure to which the contact signal block is mounted. According to one such embodiment illustrated in FIG. 3, the housing (only a portion of which is shown) includes one or more alignment plates 110 that hold the spring probes and their matching conductors in precise alignment to each other.

Figure 4:
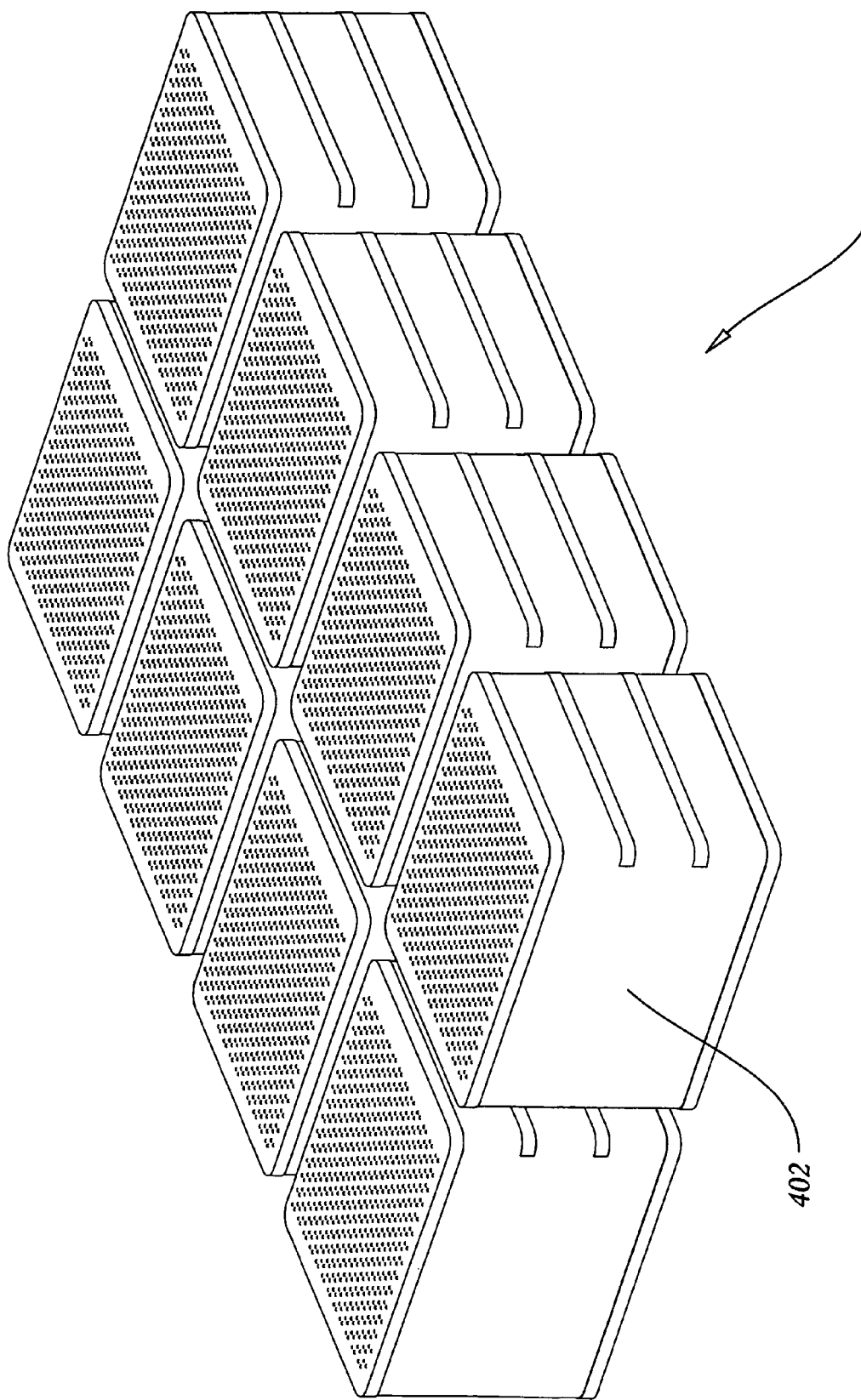
FIG. 4 shows an array of contact signal blocks according to a specific embodiment of the invention.

According to some embodiments an example of which is shown in FIG. 4, a contact signal block 402 implemented according to the invention may be part of a larger array 400 of contact signal blocks which connect two boards, e.g., most typically a wafer probe interface board and a probe card. A wafer probe interface board typically interacts directly with the test electronics in a chip test system, while the probe card typically interacts directly with a wafer of semiconductor devices, i.e., the device under test (DUT). An exemplary housing is shown around each signal block 402.

Another requirement that conventional spring probe solutions have difficulty meeting is the need for extremely low inductance connections between power supplies in the test system and the DUT. Modern microprocessors employed by today's test systems switch on and off at very high rates. Such high speed switching transients cannot be supported by high inductance power channels, i.e., the channel will suffer "rail collapse" as the inductance of the channel prevents current from being delivered at the moment it is required, either directly to the device or the associated bypass capacitors. Stated another way, these power channels have become yet another aspect of electronic system design that must be optimized around high speed signals with rapid slew rate transients.

Figure 5:
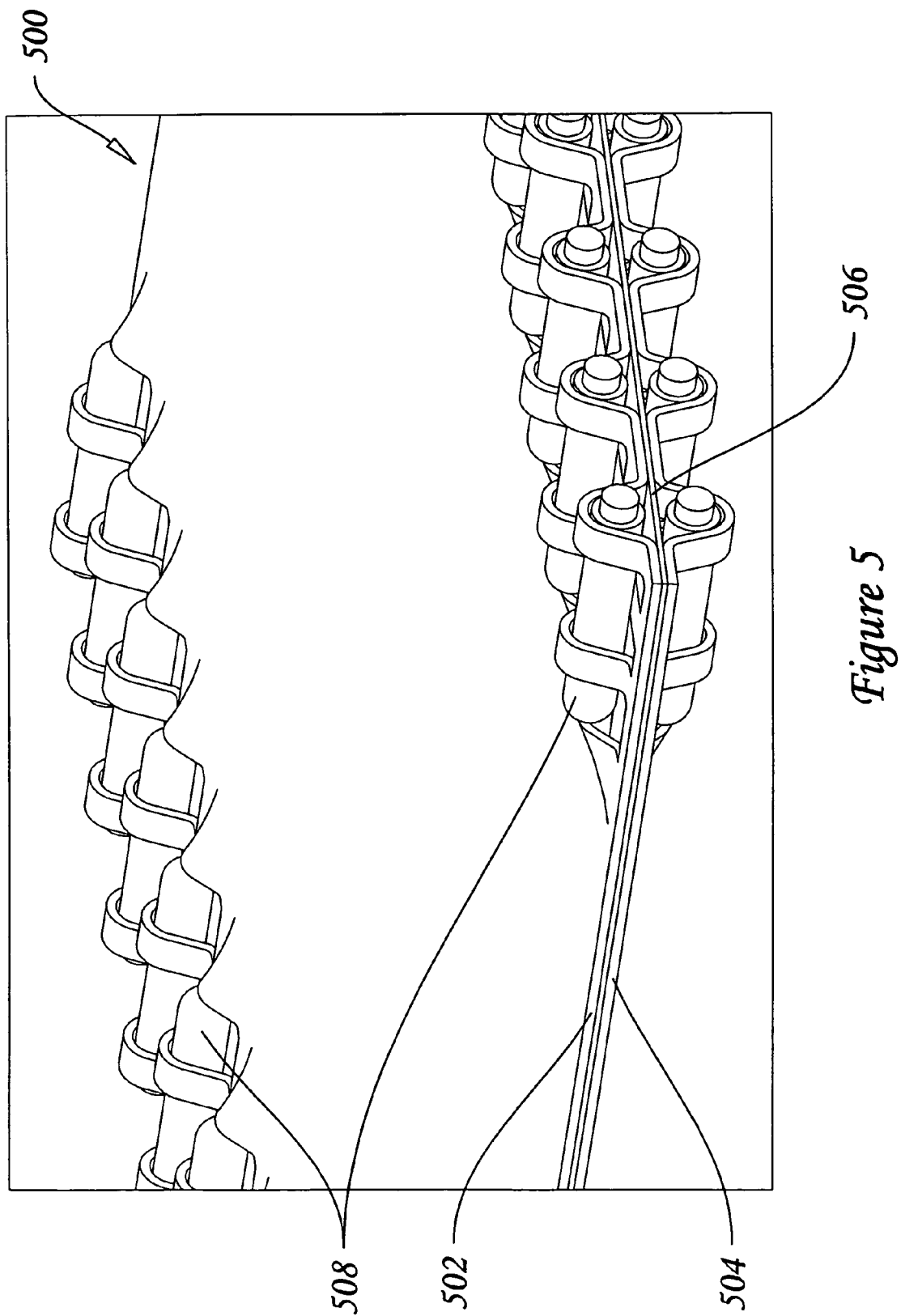
FIG. 5 shows a layer of a contact signal block according to another specific embodiment of the invention.

According to a specific embodiment of the invention shown in FIG. 5, two conductive planes 502 and 504 are mounted as close together as is practical with a non-conductive layer 506 between them to form power delivery layer 500. As a practical matter, the minimum thickness of the intervening non-conductive layer is the thickness below which dielectric breakdown would otherwise occur for the power levels expected for the particular application. A suitable dielectric for the non-conductive material is ceramic barium titanate which has a very high dielectric constant. Other suitable dielectrics include proprietary polymeric materials manufactured by various vendors, as well as more conventional materials like FR4 or G10, which, while they won't provide the highest levels of performance, may be suitable for some applications. As will be appreciated, the thickness of the dielectric layer may vary considerably depending on the material used and the power level(s) for a given application.

Figure 6:
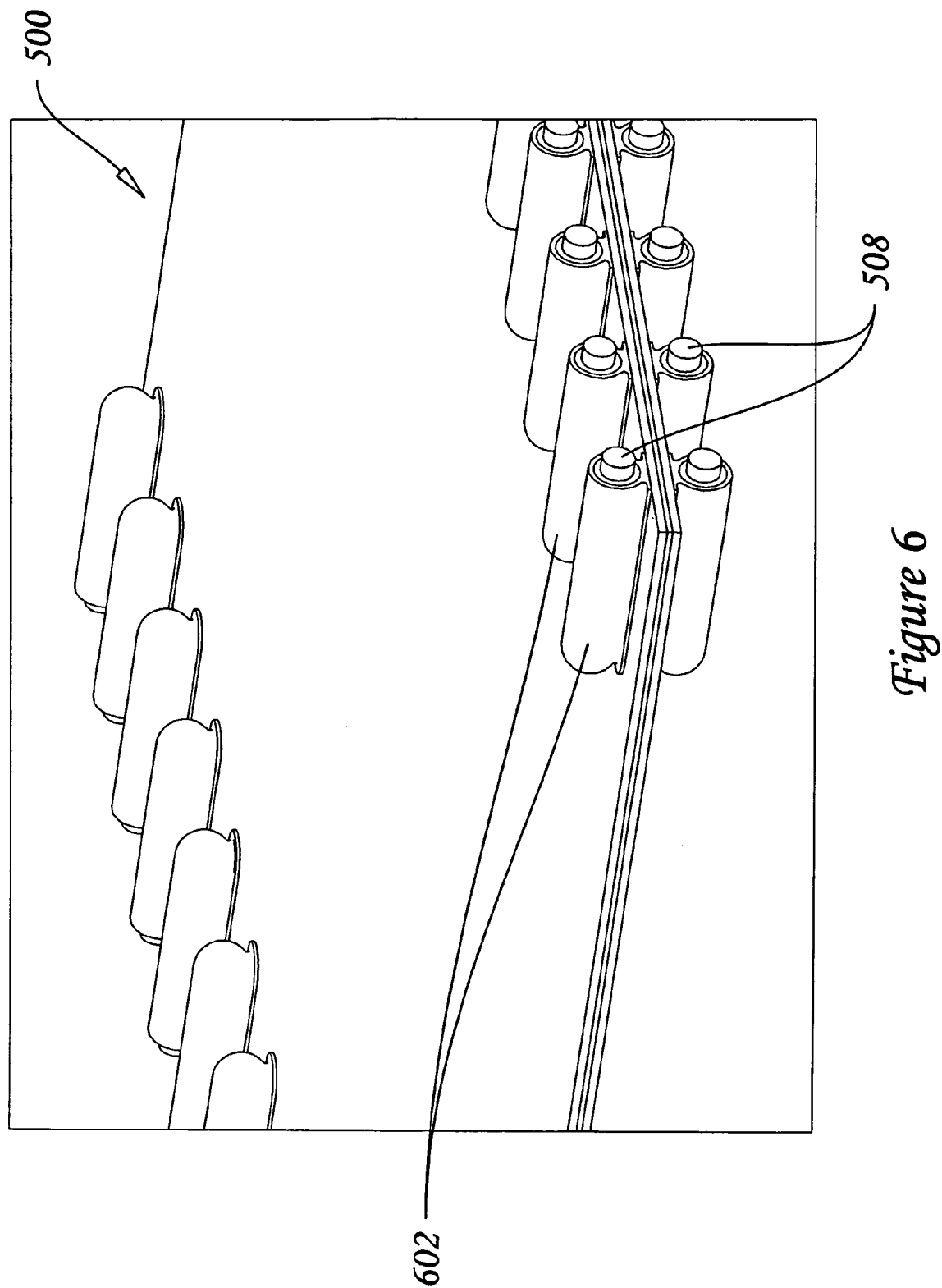
FIG. 6 illustrates a layer of a contact signal block according to yet another embodiment.

According to the embodiment shown in FIG. 5, the edges of conductive planes 502 and 504 are formed to receive spring probe terminations 508. Alternatively, receptacles for the spring probe terminations may be conductively bonded to the conductive planes. Such receptacles may be separate parts similar to the formed receptacles of FIG. 5 which are then affixed to the base material. As shown in FIG. 6, the receptacles for spring probes 508 may comprise explicit spring probe receptacles 602 (e.g., from third party manufacturers) which are affixed to the base material of power delivery layer 500. In any case, such receptacles may be affixed to the base material in a variety of ways including, for example, by soldering, e-beam welding, or any other form of conductive bonding.

The latter approach enables implementations using off-the-shelf materials for power delivery layer 500 such as, for example, embedded capacitor material. Embedded capacitor material suitable for use with various embodiments of the invention may be obtained, for example, from 3M of St. Paul, Minn., or Oak-Mitsui of Hoosick Falls, N.Y.

According to some embodiments, spring probes are not the mechanism by which the contact signal block provides its interconnection. That is, it should be noted that, according to the invention, any number of available anisotropic electrically conductive materials may be employed to make the connection between the conductive planes and the corresponding board.

Figure 7:
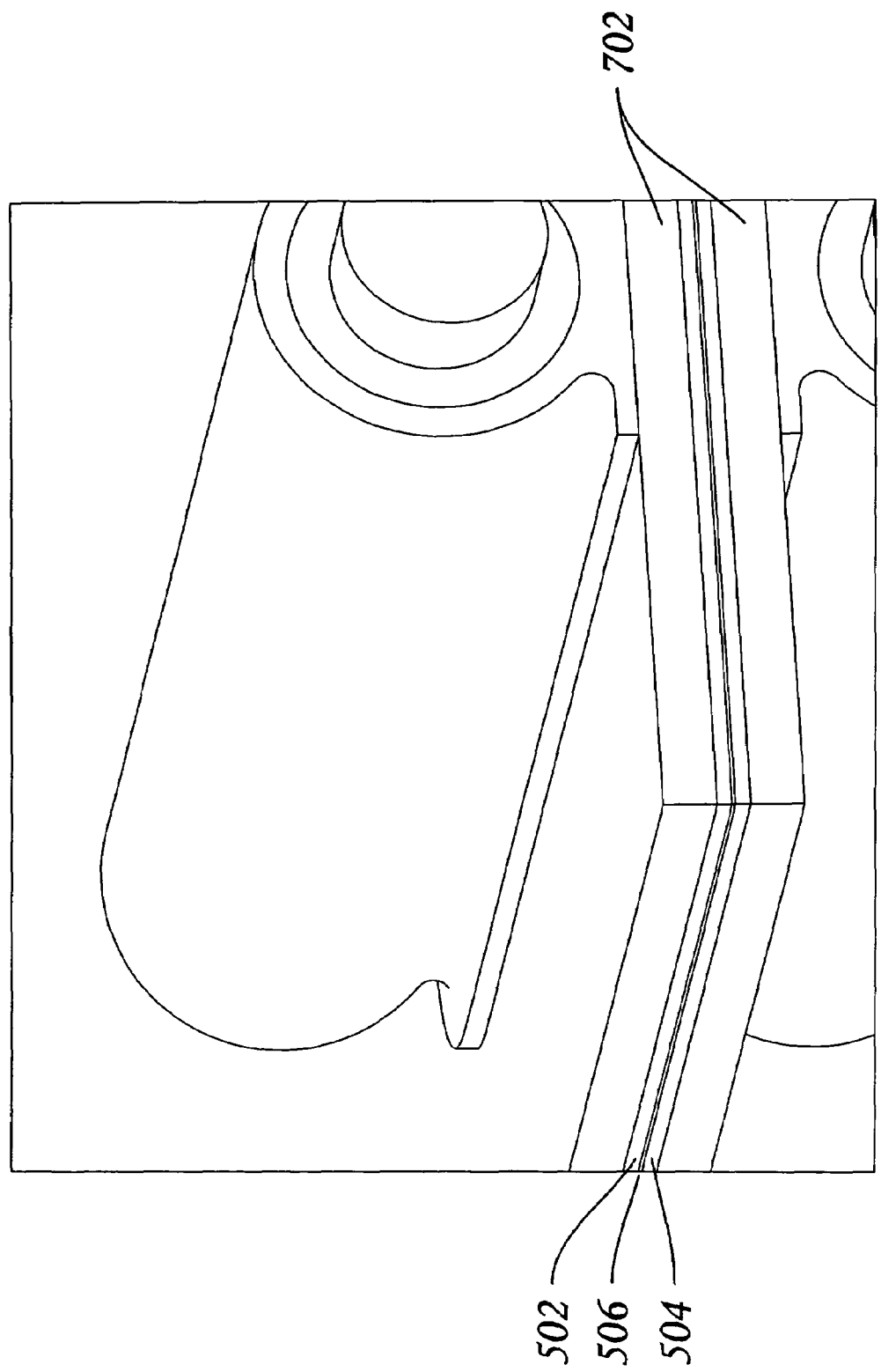
FIG. 7 illustrates a layer of a contact signal block according to still another embodiment.

For embodiments employing embedded capacitor or equivalently thin materials, it may be desirable to provide additional rigidity and/or power handling capability to the basic structure of the power delivery layer. Therefore, according to some embodiments of the invention and as shown in FIG. 7, an additional conductive material 702 (preferably the same material as the power delivery layer conductive planes 502 and 504) is bonded to the surface of one or both of the conductive planes to provide such rigidity and/or power handling capability. Another approach would be to work with the vendor of the embedded capacitor product and have them make a special run of the material with thicker conductive sheeting on either side of the dielectric material.

Figure 8:
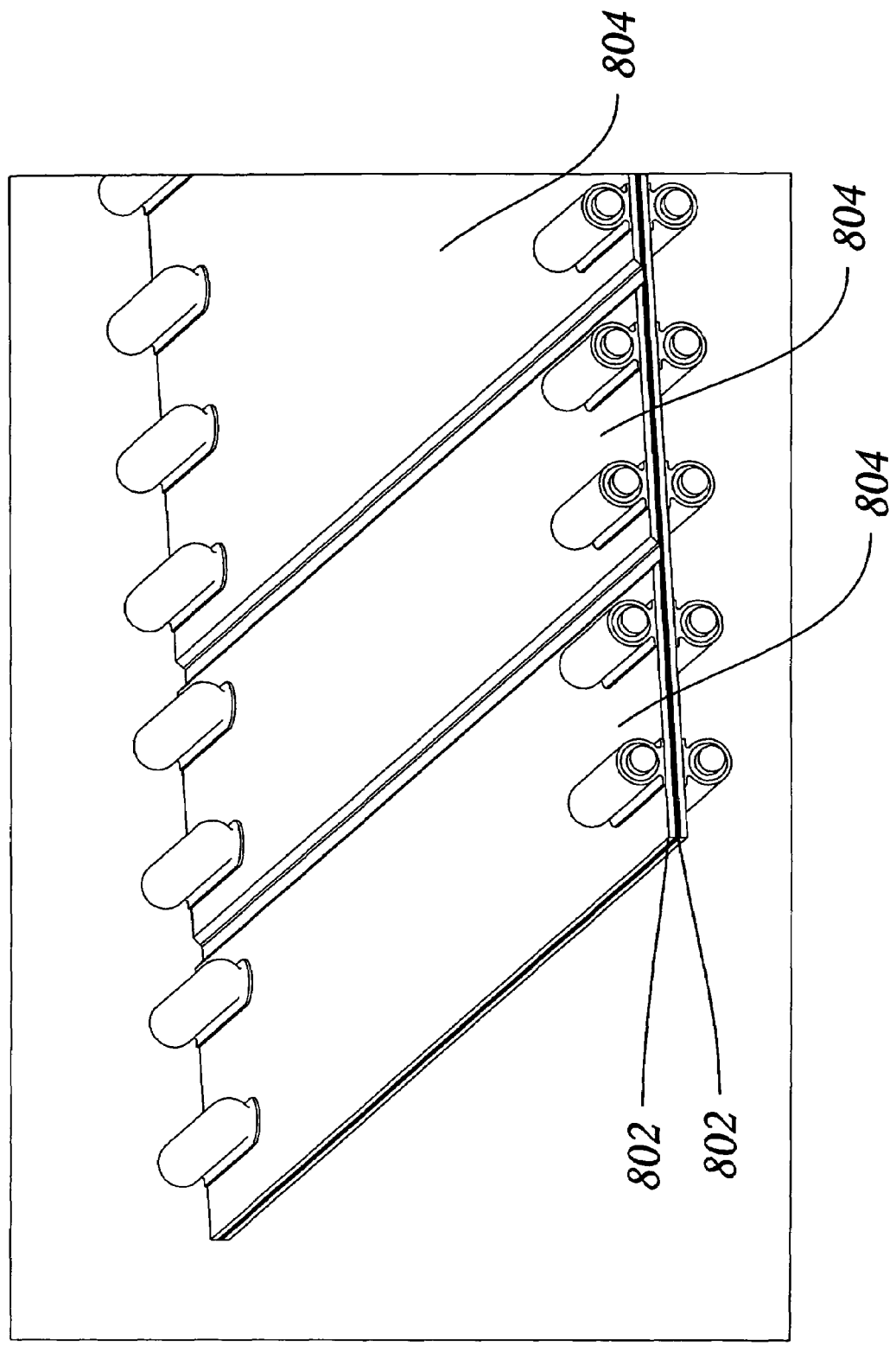
FIG. 8 shows a contact signal block layer which has been etched to form separate conductors.

Because embodiments of the invention employ a structure similar to a printed circuit board (PCB), additional features similar to PCB features may be introduced. For example, as shown in FIG. 8, regions or stripes of conductive material may be etched from one or both conductive planes 802 resulting in separate conductive regions 804 in each. Such regions could be used, for example, as power supply sense lines adjacent the geometric structures that the power supplies use. Other possibilities include, for example, providing separate conductive regions or lines for driving relays or the like.

Figure 9:
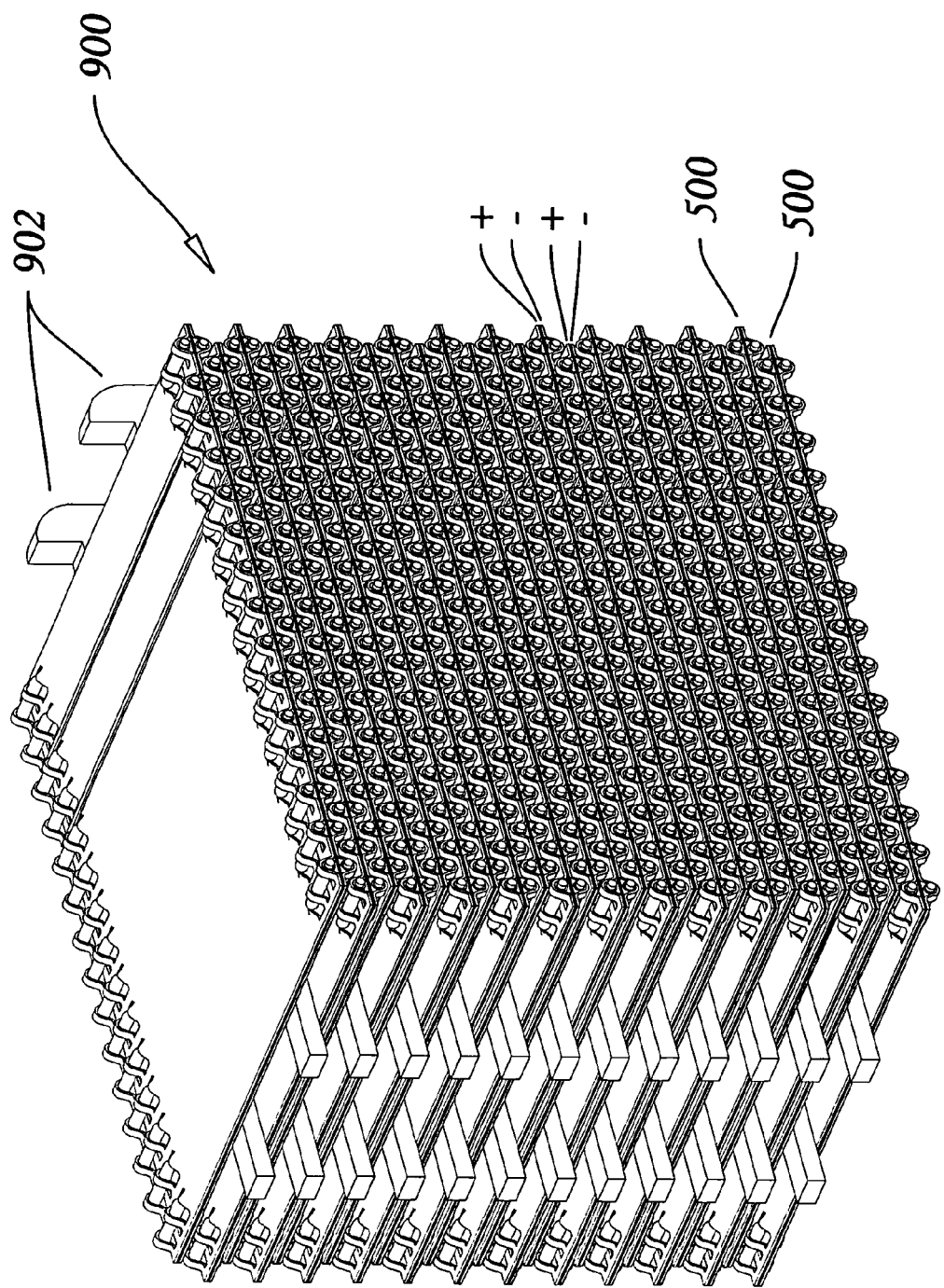
FIG. 9 shows a contact signal block comprising a plurality of the layer shown in FIG. 5.

Multiple instances of the low-inductance power delivery layer 500 shown in FIG. 5 may be configured into a low-inductance contact signal block 900 as shown in FIG. 9. Spacing between adjacent layers may be maintained with non-conductive spacer bar structures 902. In addition, the positions of the conductive plane terminations (e.g., spring probes 508) in adjacent layers 500 may be offset relative to each other as shown to allow the layers to nest together, resulting in a more compact, dense array. This close PLUS-MINUS-PLUS-MINUS geometric relationship (assuming that multiple planes are used to conduct the same power channel) may further reduce the overall inductance of the total channel.

Figure 10:
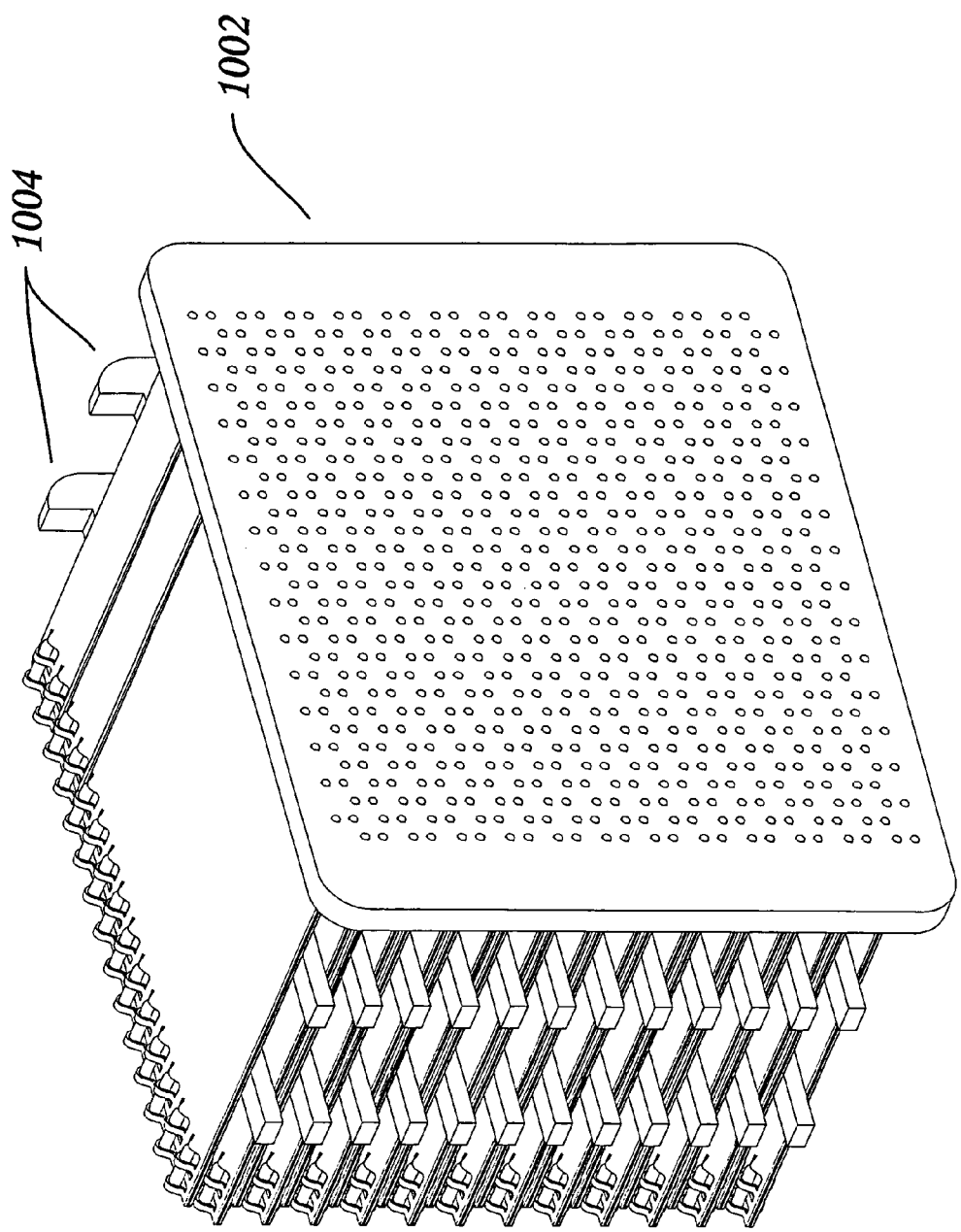
FIG. 10 illustrates another contact alignment mechanism which may be employed with various embodiments of the invention.

And as with the contact signal blocks described above with reference to FIG. 3, a contact alignment plate may be provided at either or both ends of the contact signal block which holds the conductive plane terminations, e.g., spring probes or other types of terminations, and their matching conductors in precise alignment to each other. According to specific embodiments and as shown in FIG. 10, the edge of the alignment plate(s) 1002 along with alignment features 1004 associated with the spacer bar structures may either align with or form part of the housing which insulates the contact signal block from external apparatus.

While the invention has been particularly shown and described with reference to specific embodiments thereof, it will be understood by those skilled in the art that changes in the form and details of the disclosed embodiments may be made without departing from the spirit or scope of the invention. For example, contact signal blocks have been described herein having spacer structures which maintain the separation between adjacent layers of the blocks. It should be understood that both the nature of the spacer structures and the distance between successive spacer structures may vary without departing from the invention. That is, for example, the spacer structures are shown in the figures as rectilinear bars disposed at right angles to the direction of signal propagation. However, spacer structures having different geometries (e.g., curved or having angles) and different orientations (e.g., other than 90 degrees) are contemplated. In addition, as will be understood by those of skill in the art, the distance between adjacent spacer structures between the same layers may vary depending on the rigidity of the materials used for the respective ground layers and transmission lines.

According to some embodiments, the various contact signal block structures described herein may be employed in conjunction with each other to provide both test signal and power connectivity between a test system and a DUT. In addition, features described with reference to one embodiment may be employed with any of the other embodiments described herein. For example, redundant transmission line terminations such as those shown in FIGS. 1 and 2 may be employed for the power supply sense lines of FIG. 5. Additionally, the spacer bar structure and alignment plate shown in FIG. 10 may be employed in the embodiment of FIG. 2. Other variations and combinations of features will be apparent to those of skill in the art.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A contact signal block for facilitating connections between test equipment and a device under test (DUT), comprising:
   a plurality of ground layers;
   a plurality of signal transmission layers disposed between and alternating with the ground layers, each signal transmission layer comprising a plurality of signal conductors, each signal conductor forming a controlled-impedance transmission line with adjacent ground layers and being terminated at a first end in a plurality of signal spring probes; and
   a plurality of non-conductive spacer structures separating the ground layers and signal transmission layers and maintaining a substantially constant separation between the ground layers and the signal conductors, the ground layers and the signal conductors being primarily separated by a medium having a loss tangent of approximately 0.002 and a dielectric constant of less than about 1.5.

2. The contact signal block of claim 1 wherein each of the plurality of ground layers is terminated at each end in a plurality of ground spring probes.

3. The contact signal block of claim 1 wherein the first end of each signal conductor is formed to receive the signal spring probes.

4. The contact signal block of claim 1 further comprising signal spring probe receptacles bonded to the first end of each signal conductor for receiving the signal spring probes.

5. The contact signal block of claim 1 wherein each signal conductor is terminated at a second end in another plurality of signal spring probes.

6. The contact signal block of claim 1 wherein the plurality of signal spring probes comprises two signal spring probes.

7. The contact signal block of claim 1 further comprising a non-conductive housing encapsulating the contact signal block.

8. The contact signal block of claim 7 wherein the housing comprises an alignment piece for maintaining alignment of the signal spring probes relative to each other.

9. The contact signal block of claim 1 wherein the medium comprises one of air, vacuum, and a foamed material.

10. The contact signal block of claim 1 wherein the ground layers and the signal conductors comprise any of copper, gold-plated copper, silver-plated copper, palladium-nickel-plated copper, tin-plated copper, silver, and buckypaper.

11. The contact signal block of claim 1 wherein the loss tangent is substantially zero.

* * * * *